United States Patent
Zhang et al.

(10) Patent No.: US 10,170,380 B2
(45) Date of Patent: Jan. 1, 2019

(54) ARRAY SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Ming Zhang, Beijing (CN); Guoqi Mao, Beijing (CN); Zhaohui Hao, Beijing (CN); Woong Sun Yoon, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/389,114

(22) PCT Filed: Dec. 10, 2013

(86) PCT No.: PCT/CN2013/088998
§ 371 (c)(1),
(2) Date: Sep. 29, 2014

(87) PCT Pub. No.: WO2014/176905
PCT Pub. Date: Nov. 6, 2014

(65) Prior Publication Data
US 2015/0311130 A1   Oct. 29, 2015

(30) Foreign Application Priority Data
Apr. 28, 2013 (CN) .......................... 2013 1 0157333

(51) Int. Cl.
*H01L 21/66* (2006.01)
*G02F 1/1362* (2006.01)
(Continued)

(52) U.S. Cl.
CPC ............ *H01L 22/30* (2013.01); *G02F 1/1362* (2013.01); *G02F 1/1368* (2013.01);
(Continued)

(58) Field of Classification Search
CPC ..... G02F 2001/136254; H01L 27/3223; H01L 27/1296
See application file for complete search history.

(56) References Cited

U.S. PATENT DOCUMENTS 6,310,667 B1 * 10/2001 Nakayoshi ............ G02F 1/1345
257/72
6,825,911 B2 11/2004 Lee et al.
(Continued)

FOREIGN PATENT DOCUMENTS

CN     1514275 A    7/2004
CN     1700284 A    11/2005
(Continued)

OTHER PUBLICATIONS

Chinese Office Action of Chinese Application No. 201310157333.0, dated Feb. 15, 2015 with English translation.
(Continued)

*Primary Examiner* — Lynne Gurley
*Assistant Examiner* — Peter M Albrecht
(74) *Attorney, Agent, or Firm* — Collard & Roe, P.C.

(57) ABSTRACT

An array substrate and a display device are provided. The array substrate includes a display region and a peripheral circuit region, wherein a first gate line, a first data line and a pixel region are arranged in the display region; the pixel region includes a first pixel electrode and a thin film transistor, and the thin film transistor includes a first gate electrode, a first source electrode and a first drain electrode; the peripheral circuit region is provided with at least one test unit including: a second gate line; a second data line; a
(Continued)

second testing pixel electrode; and a second testing thin film transistor. The second testing thin film transistor includes a second gate electrode, a second source electrode and a second drain electrode, wherein the second gate electrode, the second source electrode and the second drain electrode are provided with test ports exposed outside.

19 Claims, 3 Drawing Sheets

(51) Int. Cl.
*G02F 1/1368* (2006.01)
*H01L 27/12* (2006.01)

(52) U.S. Cl.
CPC ...... *G02F 1/136286* (2013.01); *H01L 27/124* (2013.01); *G02F 2001/136254* (2013.01)

(56) References Cited

U.S. PATENT DOCUMENTS

| | | |
|---|---|---|
| 7,145,533 B2 | 12/2006 | Imamura |
| 8,053,293 B2 | 11/2011 | Kim et al. |
| 2003/0122989 A1* | 7/2003 | Park .................... G02F 1/13458 349/43 |
| 2003/0180975 A1* | 9/2003 | Fujita ................. G02F 1/13454 438/17 |
| 2003/0231149 A1* | 12/2003 | Kawamura ....... G02F 1/134363 345/76 |
| 2006/0033852 A1 | 2/2006 | Kim |
| 2006/0066553 A1* | 3/2006 | Deane ................. G09G 3/3648 345/98 |
| 2007/0034522 A1 | 2/2007 | Park et al. |
| 2008/0062341 A1* | 3/2008 | Tanaka ............. G02F 1/136213 349/38 |
| 2008/0123005 A1 | 5/2008 | Sohn et al. |
| 2010/0127258 A1 | 5/2010 | Kang et al. |
| 2010/0128012 A1* | 5/2010 | Numao ................ G09G 3/3659 345/211 |
| 2012/0092607 A1* | 4/2012 | Hui .................... G02F 1/134336 349/143 |
| 2012/0113333 A1* | 5/2012 | Oba ...................... G02F 1/1345 349/5 |
| 2012/0212698 A1* | 8/2012 | Lee ....................... G02F 1/1341 349/138 |
| 2012/0242914 A1* | 9/2012 | Hara .................... G02F 1/1333 349/5 |

FOREIGN PATENT DOCUMENTS

| | | | |
|---|---|---|---|
| CN | 101110443 A | | 1/2008 |
| CN | 101236338 A | | 8/2008 |
| CN | 101527305 A | | 9/2009 |
| CN | 101770122 A | * | 7/2010 |
| CN | 103246092 A | | 8/2013 |
| JP | 2004219706 A | | 8/2004 |
| KR | 20060123946 A | * | 12/2006 |

OTHER PUBLICATIONS

English Translation of the International Search Report of CN/2013/088998 published in English dated Nov. 6, 2014.
International Search Report, International Preliminary Report on Patentability and Written Opinion of the International Searching Authority of PCT/CN2013/088998 in Chinese, dated Mar. 13, 2014.
English translation of the International Preliminary Report on Patentability and Written Opinion of the International Searching Authority of PCT/CN2013/088998, dated Nov. 3, 2015.

* cited by examiner

ARRAY SUBSTRATE AND DISPLAY DEVICE

CROSS REFERENCE TO RELATED APPLICATIONS

This application is the National Stage of PCT/CN2013/088998 filed on Dec. 10, 2013, which claims priority under 35 U.S.C. § 119 of Chinese Application No. 201310157333.0 filed on Apr. 28, 2013, the disclosure of which is incorporated by reference.

TECHNICAL FIELD

Embodiments of the invention relate to array substrate and display device.

BACKGROUND

Main body structure of a thin film transistor liquid crystal display (TFT-LCD) comprises an array substrate, a backlight and a drive circuit board.

The array substrate of the TFT-LCD is of a layered structure formed by arranging a gate line, a gate insulating layer, an active layer, a source electrode, a drain electrode, a data line, a passivation layer and a pixel electrode on a transparent glass substrate, and is divided into a display region and a peripheral circuit region located in a periphery of the display region, wherein the peripheral circuit region is used for setting a data line driving integrated circuit or a gate line driving integrated circuit.

At present, tests on the array substrate include device performance test for thin film transistor (TFT) and test for electrical properties such as stray capacitance between films. Because both pixel and circuits on the array substrate are encapsulated internally after the array substrate is completed, it is impossible to directly implement contact measurement on TFT performance after the liquid crystal cell is formed as well as electrical properties such as capacitance in the liquid crystal cell. Conventional TFT performance tests are generally finished through setting test units for capacitance, resistance and the like on blank region of the TFT substrate to acquire capacitance, resistance and other electrical properties on TFT and TFT component; performance parameter in pixel on the TFT substrate can be acquired through testing the test unit because the test unit and the TFT are formed by the same technology. However, the films may be scratched by a test probe, that is, pixels may be damaged by the method, and accordingly, this method is only suitable for testing pixel electrical properties before coating alignment layer (Polyimide film, i.e., PI film). In practice, after the liquid crystal cell is formed, due to existence of the PI film, electrical properties inside the array substrate can be actually reflected through electrical properties of the liquid crystal layer and the like (working state or non-working state). By using the test method mentioned above, it is impossible to acquire performance parameters of the tested TFT after liquid crystal cell is formed by bonding the array substrate and the color film substrate, as well as performance indexes such as internal capacitance of the liquid crystal cell. However, TFT performance after forming the liquid crystal cell and electrical data such as internal capacitance of the liquid crystal cell, are quite important for performance assessment and improvement of the liquid crystal display device. Therefore, a method is required to acquire the electrical data.

SUMMARY OF THE INVENTION

An embodiment of the present invention provides An array substrate, comprising a display region and a peripheral circuit region located outside the display region, wherein a plurality of first gate lines, a plurality of first data lines and a plurality of pixel regions surrounded by the first gate lines and the first data lines are arranged in the display region; each pixel region includes a first pixel electrode and a first thin film transistor, and the first thin film transistor includes a first gate electrode connected to the first gate line, a first source electrode connected to the first data line and a first drain electrode connected to the pixel electrode; wherein the array substrate further comprises at least one test unit arranged in the peripheral circuit region, the test unit comprises:

a second gate line and a second data line intersecting with each other, wherein when the array substrate is in a working state, a signal inputted to the second gate line is identical with a signal inputted to a corresponding first gate line, and a signal inputted to the second data line is identical with a signal inputted to a corresponding first data line;

a second testing pixel electrode arranged close to an intersection of the second gate line and the second data line;

a second testing thin film transistor arranged at the intersection of the second gate line and the second data line, wherein the second testing thin film transistor includes a second gate electrode connected to the second gate line, a second source electrode connected to the second data line and a second drain electrode connected to the second testing pixel electrode, wherein the second gate electrode, the second source electrode and the second drain electrode are provided with test ports exposed outside.

In an example, the second testing pixel electrode and the first pixel electrode in the display region are arranged on a same layer, and are identical in material and shape.

In an example, the second gate electrode and the first gate electrode are arranged on a same layer, and are identical in material.

In an example, the second source electrode and the first source electrode are arranged on a same layer, and are identical in material.

In an example, the second drain electrode and the first drain electrode are arranged on a same layer, and are identical in material.

In an example, the second gate line is formed by an extension of the first gate line; The second data line is formed by an extension of the first data line.

In an example, a plurality of total pitch patterns are formed in the peripheral circuit region, at least one reserved region is formed among the plurality of total pitch patterns, and at least one test unit is formed in the reserved region.

In an example, the peripheral circuit region is further provided with a dummy pixel electrode, and the second testing pixel electrode is formed by the dummy pixel electrode.

In an example, a test port for the second gate electrode is formed by a tail end of the second gate line; a test port for the second source electrode is formed by a first test lead exposed outside, and the first test lead is connected to the second data line; a test port for the second drain electrode is formed by a second test lead exposed outside, wherein the second drain electrode is connected to the second test lead through a second transparent conductive connecting line; one end of the second transparent conductive connecting line is connected to the pixel electrode, and the other end thereof is connected to the second test lead; the second transparent conductive connecting line and the second testing pixel electrode are arranged on a same layer, and are identical in material.

In an example, the display region is further provided with a first common electrode line and a first common electrode connected to the first common electrode line; the test unit further includes: a second common electrode line, wherein when the array substrate is in a working state, a signal inputted to the second common electrode line is identical with a signal inputted to the first common electrode line; a second testing common electrode connected to the second common electrode line, wherein the second testing common electrode and the first common electrode are arranged on a same layer and are identical in material and shape; and the second testing common electrode is connected to a third test lead exposed outside.

In an example, the second testing common electrode and the third test lead are connected through a first transparent conductive connecting line which is located on the same layer with the first testing transparent conductive layer, wherein one end of the first transparent conductive connecting line is connected to the first testing transparent conductive layer and the other end thereof is connected to the third test lead, and the first transparent conductive connecting line and the second testing common electrode are identical in material.

Another embodiment of the present invention provides a display device comprising any of the array substrate described above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make technical solutions of the embodiments of the invention apparent, the drawings necessary for describing the embodiments or the prior art will be briefly introduced. It is obvious that the described embodiments are merely related to some embodiments of the invention, and do not limit the present invention.

As to the failing of testing TFT performance as well as properties such as capacitance in the array substrate after the liquid crystal cell is formed in the prior art, an embodiment of the present invention provides an array substrate capable of testing TFT performance as well as properties such as capacitance of the array substrate without damage to the array substrate.

In embodiments of the present invention, a test unit is arranged in a peripheral circuit region on the array substrate, so as to effectively avoiding the failing of testing internal TFT performance as well as properties such as capacitance after the display panel is cell-assembled in the prior art.

Figure 1:
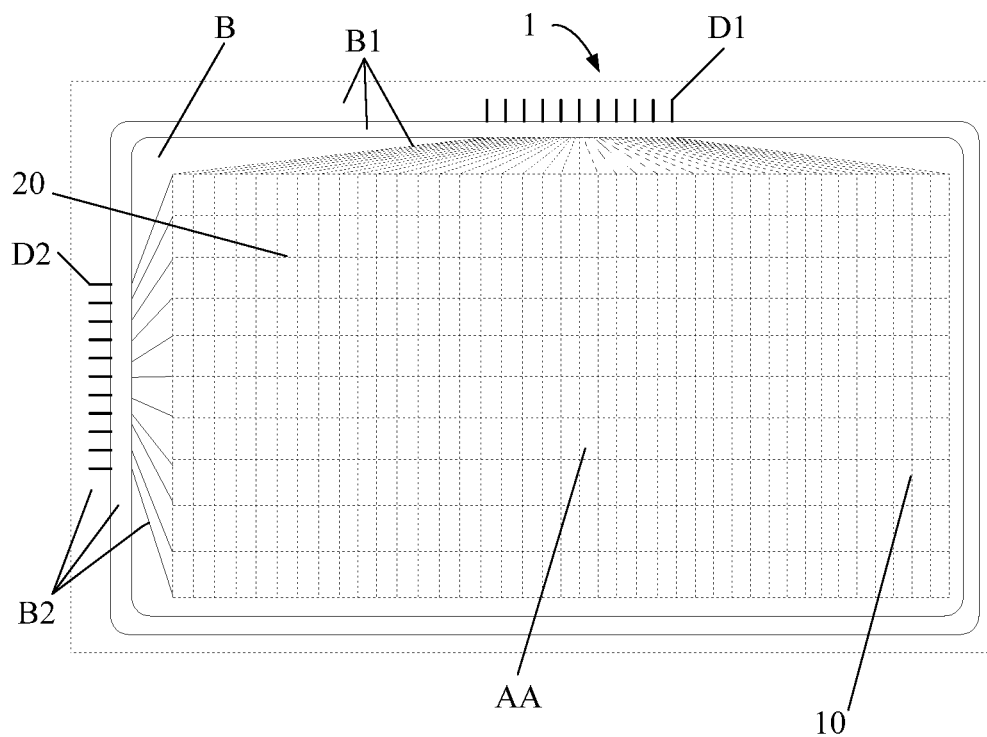
FIG. 1 is an arrangement schematic diagram of gate lines and data lines on an array substrate according to an embodiment of the present invention.
Figure 2:
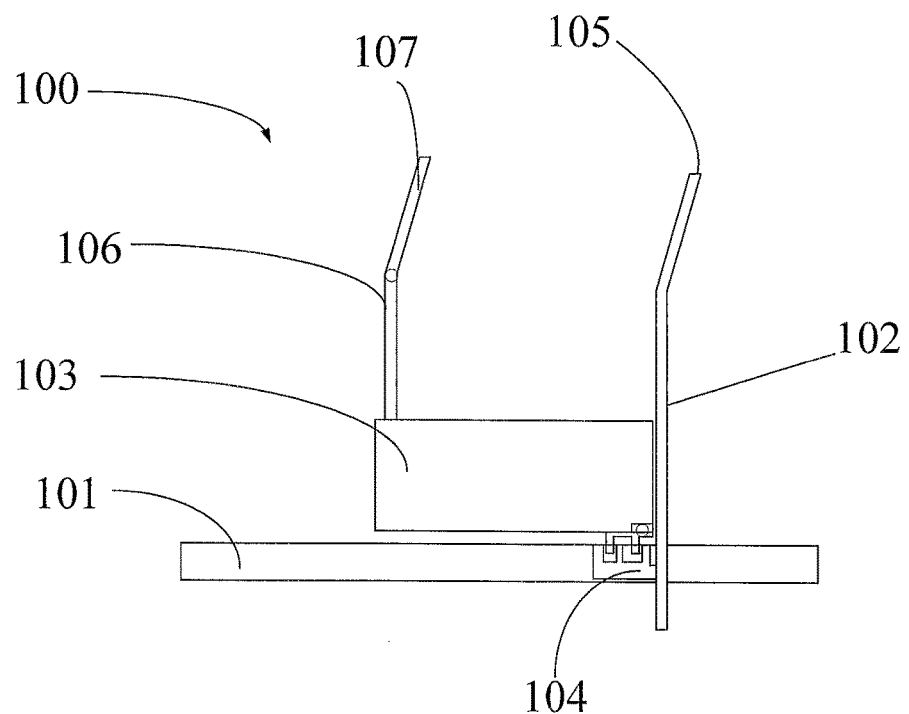
FIG. 2 is a structural schematic diagram of a measuring unit according to an embodiment of the present invention.

An embodiment of the present invention provides an array substrate, as shown in FIG. 1, comprising a display region AA and a peripheral circuit region B located in a periphery of the display region AA, wherein a plurality of first gate lines 20, a plurality of first data lines 10 and a plurality of pixel regions enclosed by the first gate lines 20 and the first data lines 10 are arranged in the display region; each pixel region includes a first pixel electrode and a first thin film transistor (not shown) for display; and the first thin film transistor includes a first gate electrode connected to the first gate line 20, a first source electrode connected to the first data line 10 and a first drain electrode connected to the pixel electrode;

As shown in FIG. 2, at least one test unit 100 is provided in the peripheral circuit region B, and the test unit 100 includes:

A second gate line 101 and a second data line 102 intersecting with each other, wherein when the array substrate is in a working state, a signal supplied to the second gate line 101 is identical with a signal supplied to the first gate line 20, and a signal supplied to the second data line 102 is identical with a signal supplied to the first data line 10;

A second testing pixel electrode 103 arranged nearby an intersection of the second gate line 101 and the second data line 102;

A testing thin film transistor 104 arranged at the intersection of the second gate line 101 and the second data line 102, wherein the testing thin film transistor 104 includes a second gate electrode connected to the second gate line 101, a second source electrode connected to the second data line 102 and a second drain electrode connected to the second testing pixel electrode 103, wherein the second gate electrode, the second source electrode and the second drain electrode are provided with test ports exposed outside.

In the above scheme, by using the second testing pixel electrode 103, the testing TFT 104 with test ports exposing its electrodes, the second gate line 101 and the second data line 102 arranged in the peripheral circuit region, electrical properties of the testing TFT 104 can be tested while keeping the array substrate intact and not damaging the array substrate, so as to implement performance test on TFTs of the array substrate.

In an example, the second testing pixel electrode 103 and the first pixel electrode for displaying in the display region are arranged in the same layer, and are identical in material and shape; the second gate electrode and the first gate electrode are arranged in the same layer, and are identical in material; the second source electrode and the first source electrode are arranged in the same layer, and are identical in material; the second drain electrode and the first drain electrode are arranged in the same layer, and are identical in material; the second gate line 101 and the first gate line 20 are arranged in the same layer and are identical in material; the second data line 102 and the first data line 10 are arranged on the same layer and are identical in material.

In the process of manufacturing the above array substrate, the second testing pixel electrode 103 can be formed in the peripheral circuit region while the first pixel electrode for displaying is formed in the display region; the second testing TFT 104 is formed in the peripheral circuit region while the first TFT for displaying is formed in the display region; and the second gate line 101 and the second data line 102 are formed in the peripheral circuit region while the first gate line 20 and the first data line 10 are formed in the display region; accordingly, the second testing pixel electrode 103 and the testing TFT 104 are respectively identical with the first pixel electrode and the first TFT for displaying, and electrical properties of the second testing pixel electrode 104 and the testing TFT 104 are identical with those of the first pixel electrode and the first TFT in the display region, so that TFT performance of the display region is accurately reflected through performance of the testing TFT 104 of the test unit 100.

In addition, in the embodiment, for example, the second gate line 101 is formed by extending the first gate line 20 into the peripheral circuit region, and the second data line 102 is formed by extending the first data line 10 into the peripheral circuit region.

In an example, as shown in FIG. 1, on the array substrate 1 of the TFT-LCD panel, a data line driving integrated circuit D1 is arranged for example in a zone B1 of the peripheral circuit region B, and the first data lines 10 pass through the B1 zone; in the peripheral circuit region, no data line driving integrated circuit is arranged on the opposite side of the B1 zone, thus the first data lines 10 will not pass therethrough; similarly, a gate line driving integrated circuit D2 is arranged in a zone B2 of the peripheral circuit region B, and the first gate lines 20 pass through the B2 zone; in the peripheral circuit region, no gate line driving integrated circuit is arranged on the opposite side of the B2 zone, thus the first gate lines 20 will not pass therethrough.

As shown in FIG. 2, in an example, the second gate line 101 and the second data line 102 can be formed by the gate line and the data line arranged in the peripheral circuit region B as shown in FIG. 1 (i.e., the second gate line 101 is formed by extension of the first gate line 20, and the second data line 102 is formed by extension of the first data line 10). In this case, the test unit 100 is preferably arranged on the side B1 of the data line driving integrated circuit and on the side B2 of the gate line driving integrated circuit of the array substrate, so that the data lines and the gate lines in the B1 and B2 zones can be directly connected to the second source electrode and the second gate electrode of the test unit 100, respectively. Certainly, it can be understood that in practical application, the test unit 100 can also be arranged on the opposite sides of the data line driving integrated circuit and the gate line driving integrated circuit, and the second gate line 101 and the second data line 102 are respectively formed by transforming peripheral circuits of the first gate line and the first data line, or the second gate line 101 and the second data line 102 are formed by additionally providing a gate line and a data line in the peripheral circuit region.

In an example, a test unit 100 can be optionally formed on a position of the peripheral circuit region of the array substrate which will be sheltered by a black matrix, a polarizer or the like after cell assembling, so that display effect of the array substrate will not be affected by the test unit 100 in the peripheral circuit region.

Figure 3:
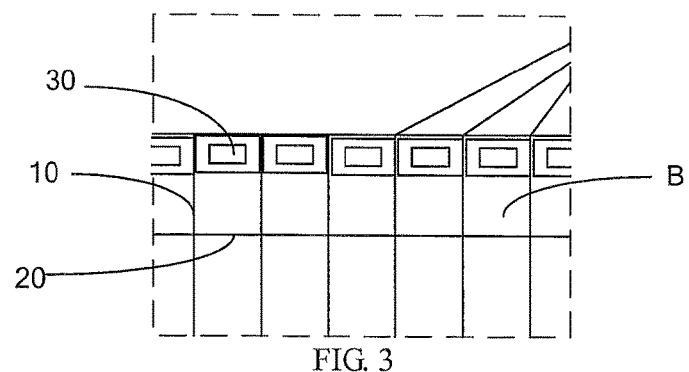
FIG. 3 is an arrangement schematic diagram of total pitch patterns in a peripheral circuit region of the array substrate according to the embodiment of the present invention.

For example, total pitch patterns (TP patterns) 30 are provided in the peripheral circuit region of the array substrate according to the embodiment of the present invention, so as to test deviation of respective films formed on a glass substrate when the array substrate is fabricated. FIG. 3 is a schematic diagram showing arrangement of the total pitch patterns on the side of the data line driving integrated circuit on the array substrate of the TFT-LCD panel. As shown in FIG. 3, there can be thousands of TP patterns 30, and TP pattern 30 structures are repeated structures and some repeated structures may be adjacent to each other. Also, one of two adjacent completely identical TP patterns can be canceled (test data of the canceled TP pattern can be replaced by the test data of its adjacent TP pattern, and it is not strictly required that there shall be tens and hundreds of same TP patterns in an array substrate, so cancellation of at least one such TP pattern has no influence on testing deviations of respective films formed on the glass substrate when the array substrate is fabricated).

Figure 4:
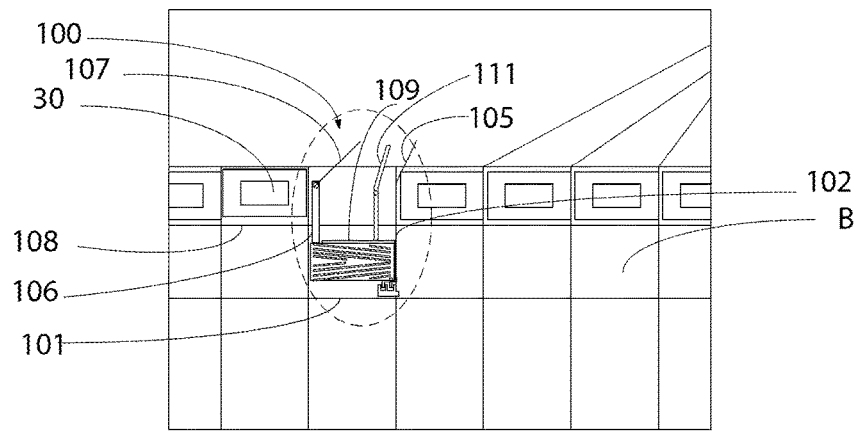
FIG. 4 is a structural schematic diagram showing a measuring unit arranged in a region where the total pitch patterns are distributed.

Therefore, as shown in FIG. 4, space between the two TP patterns adjacent to the canceled TP pattern forms a reserved region; the second testing pixel electrode 103 and the second testing TFT 104 of the test unit 100 can be arranged in the reserved region. The distribution of metal wires in the reserved region can be transformed so that the second gate line 101 and the second data line 102 intersecting with each other can be distributed in the periphery of the reserved region (that is, the test unit 100 can be arranged on the position of the canceled TP pattern).

As shown in FIG. 3, in an example, the reserved region is located on the side of the data line driving integrated circuit, so that the second data line 102 can be directly powered through the data line of the TP pattern adjacent to the reserved region, and a signal of the second gate line 101 can be supplied by the first gate line corresponding to the reserved region.

It shall be understood that the second gate line 101 and the second data line 102 can also be formed by transforming the first data line and the first gate line adjacent to the reserved region, or by adding intersected gate line and data line in the reserved region.

In the above example, the test unit 100 is arranged in the TP pattern region, and generally the TP pattern region is covered by a black matrix or sheltered by polarizer etc. Therefore, display quality of the array substrate is not affected by the test unit 100 arranged in this region.

In an example, one or two columns of dummy pixel electrodes (having pixel frame but having no TFT structure) can be formed in the peripheral circuit region of the array substrate according to an embodiment of the present invention, when the first pixel electrode is formed in the display region. In this case, the test unit 100 can be arranged in regions of the dummy pixel electrodes. For example, the second gate line 101 and the second data line 102 intersecting with each other are distributed in the periphery of the dummy pixel electrode, and the second testing pixel electrode 103 is formed by the dummy pixel electrode.

In the above embodiment, the second testing pixel electrode 103 of the test unit 100 can directly use the dummy pixel electrode. The dummy pixel electrode region can be covered by a black matrix, a polarizer or the like. Therefore, quality of the array substrate is not affected by providing the test unit 100 in the dummy pixel electrode region.

A forming process of respective films in the display region of the array substrate according to the embodiment of the present invention can be identical with a forming process of corresponding films in the display region of the prior art, and respective films in the display region can be identical with the corresponding films of the array substrate of the prior art in structure, so the details thereof are omitted here.

As shown in FIG. 2, the test unit 100 in the peripheral circuit region of the array substrate according to the embodiment of the present invention includes:

a second gate line 101 and a second data line 102 intersecting with each other in the peripheral circuit region, wherein the second gate line 101 is identical with the first gate line 20 in the display region in signal supply; in an example, the second gate line 101 can be directly formed by the first gate line 20, and the second data line 102 is identical with the first data line of the display region in signal supply;

in an example, the second data line 102 can be directly formed by the first data line 10.

a second testing pixel electrode 103 formed in the peripheral circuit region while the first pixel electrode in the display region is formed, wherein the second testing pixel electrode 103 and the pixel electrode in the display region are identical in material and shape and are arranged on the same layer.

a second testing TFT 104 which is formed in the peripheral circuit region and is identical with the first TFT for display in the display region in terms of material while the first TFT for display in the display region is formed, wherein the second testing TFT 104 includes: a second source electrode formed in the peripheral circuit region while the first source electrode of the first TFT in the display region is formed, wherein the second source electrode and the first source electrode are identical in material and are arranged on the same layer, and the second source electrode is connected to the second data line 102.

a second gate electrode of the second TFT formed in the peripheral circuit region while the first gate electrode of the first TFT in the display region is formed, wherein the second gate electrode and the first gate electrode are identical in material and are arranged on the same layer, and the second gate electrode is connected to the second gate line 101.

a second drain electrode of the second TFT formed in the peripheral circuit region while the first drain electrode of the first TFT in the display region is formed, wherein the second drain electrode and the first drain electrode are identical in material and are arranged on the same layer, and the second drain electrode is connected to the second testing pixel electrode 103 through a via hole in a passivation layer.

In an example, a test port for the second gate line 101 can be formed by a tail end of the second gate line 101; in an example, a test port for the second gate line 101 can adopt a tail end of the first gate line, and an electrical signal can be inputted to the second gate line 101 from the tail end of the first gate line.

A test port for the second source electrode can be formed by leading a first test lead 105 from the second data line 102, and the first test lead 105 is exposed to the outside the array substrate, so that an electrical signal of the second source electrode is acquired through the first test lead 105.

A test port for the second drain electrode can be formed by forming a second Indium Tin Oxide (ITO) layer for the second testing pixel electrode 103 and a second test lead 107 which is connected to the second ITO layer and exposed to the outside. For example, when the second testing pixel electrode 103 is formed from the second ITO layer through a developing and etching process, a second transparent conductive connecting line 106 is additionally formed in the peripheral circuit region; the second transparent conductive connecting line 106 is arranged on the same layer with the second testing pixel electrode 103 and is integrally formed with the second testing pixel electrode 103; as shown in FIG. 2, the second transparent conductive connecting line 106 is of a strip-shaped structure; the second test lead 107 is arranged on the same layer with the first test lead 105, with one end thereof connected to the second testing pixel electrode 103 and the other end thereof connected to the second test lead 107 which is exposed to the outside of the array substrate through a via hole in a insulating layer; in this way, a tail end of the second test lead 107 just forms the test port for the second drain electrode and the second test lead 107 is exposed to the outside of the array substrate, so that an electrical signal of the drain electrode can be acquired through the second test lead 107. In another example, the second transparent conductive connecting line 106 can be in other proper shapes.

By using the scheme above, the test ports for the second gate electrode, the second drain electrode and the second source electrode are respectively exposed to the outside of the array substrate; when TFT performance is tested, an electrical signal of TFT is acquired through the second gate electrode, the first test lead 105 and the second test lead 107, thus testing TFT performance of liquid crystal display panel.

In addition, for example, the array substrate provided according to an embodiment of the present invention described below can test capacitance of the array substrate through the test unit 100.

Figure 5:
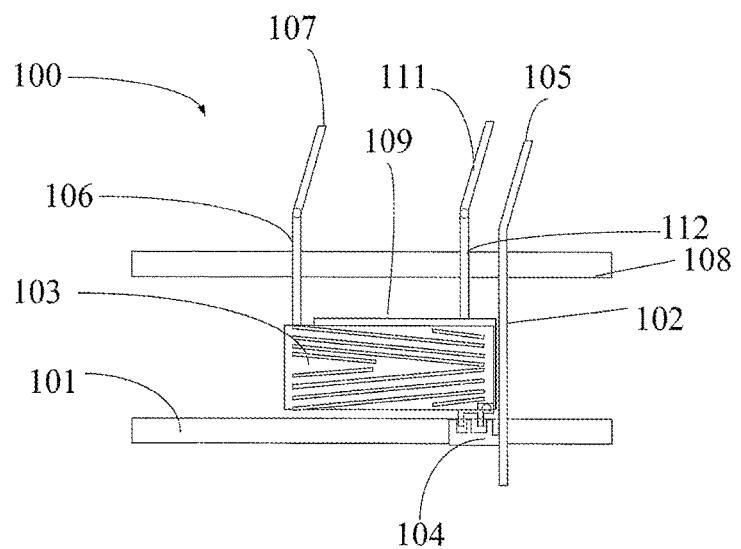
FIG. 5 is a structural schematic diagram of a measuring unit according to another embodiment.

For example, as shown in FIG. 5, a first common electrode line and a first common electrode (a transparent conductive layer) connected to the first common electrode line are additionally provided in the display region of the array substrate.

The test unit 100 includes: a second gate line 101 and a second data line 102 intersecting with each other in the peripheral circuit region, wherein the second gate line 101 is identical with the first gate line of the display region in signal supply; in an example, the second gate line 101 can be directly formed by the first gate line; the second data line is identical with the first data line of the display region in signal supply; in an example, the second data line 102 can be directly formed by the first data line.

a second testing pixel electrode 103 formed in the peripheral circuit region while the first pixel electrode in the display region is formed, wherein the second testing pixel electrode 103 and the first pixel electrode in the display region are identical in material and shape and are arranged on the same layer. For example, both the first pixel electrode and the second pixel electrode are formed with slits.

a second testing TFT 104 which is formed in the peripheral circuit region while the first display TFT of the display region is formed, wherein the second testing TFT 104 is identical with the first TFT for display in the display region in terms of material; for example, the second testing TFT 104 includes:

a second source electrode of the second TFT 104 formed in the peripheral circuit region while the first source electrode of the first TFT of the display region is formed, wherein the second source electrode and the first source electrode are identical in material and are arranged on the same layer, and the second source electrode is connected to the second data line 102.

a second gate electrode of the second TFT 104 formed in the peripheral circuit region while the first gate electrode of TFT of the display region is formed, wherein the second gate electrode and the first gate electrode are identical in material and are arranged on the same layer, and the second gate electrode is connected to the second gate line 101.

a second drain electrode of the second TFT 104 formed in the peripheral circuit region while the first drain electrode of TFT of the display region is formed, wherein the second drain electrode and the first drain electrode are identical in material and are arranged on the same layer, and the second drain electrode is connected to the second testing pixel electrode 103 through a via hole in a passivation layer.

Herein, a test port for the second gate line 101 can be formed by a tail end of the second gate line 101; in an example, a test port for the second gate line 101 can adopt a tail end of the first gate line, so that an electrical signal can be inputted to the second gate line 101 from the tail end of the first gate line.

A test port for the second source electrode can be formed by leading a first test lead 105 from the second data line 102, and the first test lead 105 is exposed to the outside of the array substrate, so that an electrical signal can be inputted to the second source electrode through the first test lead 105.

A test port for the second drain electrode can be formed by forming a second ITO layer for the second testing pixel electrode 103 and a second test lead 107 which is connected to the second ITO layer and is exposed outside. For example, when the second testing pixel electrode 103 is formed from the second ITO layer through a developing and etching process, a second transparent conductive connecting line 106 is additionally formed in the peripheral circuit region; the second transparent conductive connecting line 106 is arranged on the same layer with the same layer with the second testing pixel electrode 103 and is integrally formed with the second testing pixel electrode 103; as shown in FIG. 5, the second transparent conductive connecting line 106 is of a strip-shaped structure, with one end connected to the second pixel electrode 103 and the other end thereof connected to the second test lead 107 which is exposed outside through a via hole in an insulating layer; in this way, a tail end of the second test lead 107 just forms the test port for the second drain electrode. For example, the second test lead 107 is arranged on the same layer with the first test lead 105, and the second test lead 107 is exposed to the outside of the array substrate, so that an electrical signal can be inputted to the second drain electrode through the second test lead 107.

As shown in FIG. 5, for example, the test unit 100 according to the embodiment further includes a second common electrode line 108 formed in the peripheral circuit region while the first common electrode line of the display region is formed. When the array substrate is in a working state, signal inputted to the second common electrode line 108 is identical with signal inputted to the first common electrode line of the display region.

a second testing common electrode 109 (for example, a transparent conductive layer) formed in the peripheral circuit region while the first display common electrode of the display region is formed, wherein the second testing common electrode 109 is arranged on the same layer with the first common electrode, and the second testing common electrode 109 is identical with the first common electrode in material and shape; the second testing common electrode 109 is connected to a third test lead 111 exposed outside.

In an example, the second testing common electrode 109 is connected to the third test lead 111 through the first transparent conductive connecting line 112 which is arranged on the same layer with the second testing common electrode; for example, both the second testing common electrode 109 and the first transparent conductive connecting line 112 are formed from the first ITO layer through a developing and etching process; when the first transparent conductive layer 109 is formed from the first ITO layer through the developing and etching process, a first transparent conductive connecting line 112 is formed in the peripheral circuit region from the first ITO layer through the developing and etching process; accordingly, the first transparent conductive connecting line 112 is arranged on the same layer with the second testing common electrode 109, and is integrally formed with the second testing common electrode 109.

As shown in FIG. 5, for example, the first transparent conductive connecting line 112 is of a strip-shaped structure, with one end thereof connected to the second testing common electrode 109 and the other end thereof directly across and electrically connected to the second common electrode line 108. And, the other end of the first transparent conductive connecting line 112 is connected to the third test lead 111 which is exposed to the outside through a via hole; the third test lead 111 is arranged on the same layer with the first test lead 105. Therefore, a tail end of the third test lead 111 is formed as a test port for the second testing common electrode 109. Since the third test lead 111 is exposed to the outside of the array substrate, an electrical signal of the second testing common electrode 109 can be tested through the third test lead 111.

By using the scheme mentioned above, properties such as capacitance of the array substrate can be tested, while the array substrate is kept intact without damage; test ports for the second gate electrode, the second drain electrode, the second source electrode, the second testing pixel electrode 103 and the second testing common electrode are respectively exposed to the outside of the array substrate; when properties such as capacitance of the array substrate are to be tested, corresponding electrical signals can be acquired through the second gate electrode, the first test lead 105, the second test lead 107 and the third test lead 111 respectively, thus achieving testing of the properties such as capacitance of the liquid crystal display panel. e.g., the capacitance in the case that the TFT 104 is turned on and the capacitance of the substrate in the case that no electrical signal is inputted thereto; and the test results can reflect the working condition of the array substrate in various states in real time.

It is important to note that the second testing pixel electrode 103 of the test unit 100 and the first pixel electrode for display in the display region should be identical in slit distribution if the capacitance of the array substrate is to be tested by the test unit 100. In this case, methods such as formula $C=\varepsilon_0\varepsilon S/d$ (where C refers to the capacitance of a capacitor consisting of two thin parallel conductive plates separated by a dielectric; $\varepsilon_0$ refers to permittivity of vacuum; e refers to permittivity of the dielectric; d refers to separation of the two plates; and S refers to the opposite area of the two plates) can be used for conversion although difference may exist between the capacitance of the test unit 100 and the capacitance of single pixel in the array substrate. Capacitance parameters of the test unit 100 and that of the pixel in the display region are identical, except for overlapping area S, and electrical properties of pixel in practical work can be actually reflected. Certainly, in an example, a test unit and an actual pixel are identical in design size.

In addition, it is noted that in an example, the first test lead 105, the second test lead 107 and the third test lead 111 are arranged on the side of the data line integrated circuit on the array substrate, and are located on the edge, thus facilitating testing and wiring. In some display modes (such as Twisted Nematic (TN) mode), the third test lead 111 electrically connected to the second common electrode can be led from the color film substrate.

In addition, it is noted that the first test lead 105, the second test lead 107 and the third test lead 111 can be sealed through insulating sealant when they are not tested, so as to prevent problems such as electric leakage.

In addition, it is noted that a plurality of test units 100 can be distributed on various positions of the peripheral circuit region of the array substrate.

In the above embodiments of the present invention, by providing the test unit having the second testing pixel electrode, the testing thin film transistor and test ports exposed outside on the peripheral circuit region, TFT performance and capacitance properties of pixel in the panel can be tested without damage to the array substrate after the array substrate is cell-assembled and even after the liquid crystal panel is fabricated.

Another embodiment of the present invention further provides a display device, which comprises the array substrate according to any embodiment mentioned above.

One example of the display device is a liquid crystal display device, wherein, a TFT array substrate and an opposite substrate are cell-assembled to form a liquid crystal cell, and the liquid crystal cell is filled with liquid crystal material therein. The opposite substrate is, for example, a color film substrate. A pixel electrode of each pixel unit of the TFT array substrate is used for exerting an electric field to control rotation of the liquid crystal material so as to perform a display operation. In some examples, the liquid crystal display further comprises a backlight source for providing backlight to the array substrate. Another example of the display device is an organic electroluminescent display device, wherein the pixel electrode of each pixel unit of the TFT array substrate is used as a positive electrode or a negative electrode for driving organic electroluminescent material to emit light so as to implement display operation.

Although the present invention has been described in detail with general statements and detailed embodiments, modifications or improvements can be made based on the present invention, which is obvious for those skilled in the art. Therefore, these modifications and improvements made without departing from the spirit of the present invention all fall into the scope sought for protection.

What is claimed is:

1. An array substrate, comprising:
a display region and a peripheral circuit region located outside the display region,
wherein a first gate line, a first data line and a pixel region adjacent to the first gate line and the first data line are arranged in the display region; the pixel region includes a first pixel electrode and a first thin film transistor, and the first thin film transistor includes a first gate electrode connected to the first gate line, a first source electrode connected to the first data line and a first drain electrode connected to the first pixel electrode;
wherein the array substrate further comprises a test unit arranged in the peripheral circuit region, the test unit comprising:
a second gate line and a second data line intersecting with each other, wherein when the array substrate is in a working state, a first signal inputted to the second gate line is identical with a second signal inputted to the first gate line, and a third signal inputted to the second data line is identical with a fourth signal inputted to the first data line;
a second testing pixel electrode arranged close to the intersection of the second gate line and the second data line;
a second testing thin film transistor arranged at the intersection of the second gate line and the second data line, wherein the second testing thin film transistor includes a second gate electrode connected to the second gate line, a second source electrode connected to the second data line and a second drain electrode connected to the second testing pixel electrode, wherein a first test port exposed outside of the display region is provided for the second gate electrode, a second test port exposed outside of the display region is provided for the second source electrode, and a third test port exposed outside of the display region is provided for the second drain electrode, wherein, the display region is further provided with a first common electrode line and a first common electrode connected to the first common electrode line;
the test unit further includes: a second common electrode line and a second testing common electrode connected to the second common electrode line, wherein the second testing common electrode and the first common electrode are arranged on a same layer and are identical in material and shape; and the second testing common electrode is connected to a third test lead through a first transparent conductive connecting line which is located on the same layer with the second testing common electrode, wherein one end of the first transparent conductive connecting line is connected to the second testing common electrode and the other end of the first transparent conductive connecting line is connected to the third test lead, and the first transparent conductive connecting line and the second testing common electrode are identical in material,
wherein, the first transparent conductive connecting line is intersected with the second common electrode line in a plan view of the array substrate.

2. The array substrate according to claim 1, wherein, the second testing pixel electrode and the first pixel electrode are arranged on a same layer, and are identical in material and shape.

3. The array substrate according to claim 1, wherein, the second gate electrode and the first gate electrode are arranged on a same layer, and are identical in material.

4. The array substrate according to claim 1, wherein, the second source electrode and the first source electrode are arranged on a same layer, and are identical in material.

5. The array substrate according to claim 1, wherein, the second drain electrode and the first drain electrode are arranged on a same layer, and are identical in material.

6. The array substrate according to claim 1, wherein, the second gate line is formed by an extension of the first gate line;
the second data line is formed by an extension of the first data line.

7. The array substrate according to claim 1, wherein, the peripheral circuit region is further provided with a dummy pixel electrode, and the second testing pixel electrode is formed by the dummy pixel electrode.

8. The array substrate according to claim 1, wherein, the first test port for the second gate electrode is formed by a tail end of the second gate line;
the second test port for the second source electrode is formed by a first test lead, and the first test lead is connected to the second data line;
the third test port for the second drain electrode is formed by a second test lead, wherein the second drain electrode is connected to the second test lead through a second transparent conductive connecting line; one end of the second transparent conductive connecting line is connected to the second testing pixel electrode, and the other end of the second transparent conductive connecting line is connected to the second test lead; the second transparent conductive connecting line and the second testing pixel electrode are arranged on a same layer, and are identical in material, the second transparent conductive connecting line is isolated from and intersected with the second common electrode line in the plan view of the array substrate.

9. The array substrate according to claim 1, wherein, when the array substrate is in the working state, a fifth signal inputted to the second common electrode line is identical with a sixth signal inputted to the first common electrode line.

10. A display device comprising:
an array substrate, the array substrate comprising a display region and a peripheral circuit region located outside the display region,
wherein a first gate line, a first data line and a pixel region adjacent to the first gate line and the first data line are arranged in the display region; the pixel region includes a first pixel electrode and a first thin film transistor, and the first thin film transistor includes a first gate electrode connected to the first gate line, a first source electrode connected to the first data line and a first drain electrode connected to the first pixel electrode;
wherein the array substrate further comprises a test unit arranged in the peripheral circuit region, the test unit comprising:
a second gate line and a second data line intersecting with each other, wherein when the array substrate is in a working state, a first signal inputted to the second gate line is identical with a second signal inputted to the first gate line, and a third signal inputted to the second data line is identical with a fourth signal inputted to the first data line;
a second testing pixel electrode arranged close to the intersection of the second gate line and the second data line;
a second testing thin film transistor arranged at the intersection of the second gate line and the second data line, wherein the second testing thin film transistor includes a second gate electrode connected to the second gate line, a second source electrode connected to the second data line and a second drain electrode connected to the second testing pixel electrode, wherein a first test port exposed outside of the display region is provided for the second gate electrode, a second test port exposed outside of the display region is provided for the second source electrode, and a third test port exposed outside of the display region is provided for the second drain electrode,
wherein, the display region is further provided with a first common electrode line and a first common electrode connected to the first common electrode line;
the test unit further includes: a second common electrode line and a second testing common electrode connected to the second common electrode line, wherein the second testing common electrode and the first common electrode are arranged on a same layer and are identical in material and shape; and the second testing common electrode is connected to a third test lead through a first transparent conductive connecting line which is located on the same layer with the second testing common electrode, wherein one end of the first transparent conductive connecting line is connected to the second testing common electrode and the other end of the first transparent conductive connecting line is connected to the third test lead, and the first transparent conductive connecting line and the second testing common electrode are identical in material,
wherein, the first transparent conductive connecting line is intersected with the second common electrode line in a plan view of the second common electrode line.

11. The array substrate according to claim 2, wherein, the second gate electrode and the first gate electrode are arranged on another same layer, and are identical in material.

12. The array substrate according to claim 2, wherein, the second source electrode and the first source electrode are arranged on another same layer, and are identical in material.

13. The array substrate according to claim 2, wherein, the second drain electrode and the first drain electrode are arranged on another same layer, and are identical in material.

14. The array substrate according to claim 2, wherein, the second gate line is formed by an extension of the first gate line;
the second data line is formed by an extension of the first data line.

15. The array substrate according to claim 2, wherein, the peripheral circuit region is further provided with a dummy pixel electrode, and the second testing pixel electrode is formed by the dummy pixel electrode.

16. The array substrate according to claim 2, wherein, the first test port for the second gate electrode is formed by a tail end of the second gate line;
the second test port for the second source electrode is formed by a first test lead, and the first test lead is connected to the second data line;
the third test port for the second drain electrode is formed by a second test lead, wherein the second drain electrode is connected to the second test lead through a second transparent conductive connecting line; one end of the second transparent conductive connecting line is connected to the second testing pixel electrode, and the other end of the second transparent conductive connecting line is connected to the second test lead; the second transparent conductive connecting line and the second testing pixel electrode are arranged on the same layer, and are identical in material.

17. The array substrate according to claim 2, wherein, when the array substrate is in the working state, a fifth signal inputted to the second common electrode line is identical with a sixth signal inputted to the first common electrode line.

18. The array substrate according to claim 1, wherein said first transparent conductive connecting line is of a strip-shaped structure, with one end connected to said second testing common electrode and the other end directly across and electrically connected to the second common electrode line.

19. The array substrate according to claim 8, wherein said first test lead, said second test lead and said third test lead are configured for testing a capacitance of the array substrate.

* * * * *